(12) United States Patent
Ramm et al.

(10) Patent No.: US 7,857,948 B2
(45) Date of Patent: Dec. 28, 2010

(54) METHOD FOR MANUFACTURING POORLY CONDUCTIVE LAYERS

(75) Inventors: Jürgen Ramm, Maienfeld (CH); Beno Widrig, Bad Ragaz (CH); Christian Wohlrab, Feldkirch (AT)

(73) Assignee: Oerlikon Trading AG, Trubbach, Trubbach (CH)

( * ) Notice: Subject to any disclaimer, the term of this patent is extended or adjusted under 35 U.S.C. 154(b) by 984 days.

(21) Appl. No.: 11/458,444

(22) Filed: Jul. 19, 2006

(65) Prior Publication Data
US 2008/0020138 A1 Jan. 24, 2008

(51) Int. Cl.
*C23C 14/34* (2006.01)

(52) U.S. Cl. .............................. 204/192.38; 204/298.41

(58) Field of Classification Search ............ 204/192.38, 204/298.41
See application file for complete search history.

(56) References Cited

U.S. PATENT DOCUMENTS

| | | | |
|---|---|---|---|
| 3,625,848 A | | 12/1971 | Snaper |
| 4,929,322 A | * | 5/1990 | Sue et al. ............... 204/192.38 |
| 4,973,388 A | * | 11/1990 | Francois et al. ............ 205/186 |
| 6,196,936 B1 | * | 3/2001 | Meckel ....................... 473/349 |
| 6,334,405 B1 | | 1/2002 | Takahara et al. |
| 6,350,356 B1 | * | 2/2002 | Welty ..................... 204/298.12 |
| 6,602,390 B1 | * | 8/2003 | Brandle et al. ......... 204/298.41 |
| 6,773,979 B2 | | 8/2004 | Okuno et al. |
| 7,518,173 B2 | | 4/2009 | Hikosaka et al. |
| 7,547,937 B2 | | 6/2009 | Yamanobe |
| 7,550,344 B2 | | 6/2009 | Ito et al. |
| 7,629,636 B2 | | 12/2009 | Nagai |
| 7,696,508 B2 | | 4/2010 | Song et al. |
| 7,732,872 B2 | | 6/2010 | Cheng et al. |

| | | | |
|---|---|---|---|
| 2003/0094362 A1 | * | 5/2003 | Gstoehl et al. ......... 204/192.12 |
| 2003/0209424 A1 | | 11/2003 | Brandle et al. |
| 2006/0175190 A1 | * | 8/2006 | Schuetze et al. ....... 204/192.38 |

FOREIGN PATENT DOCUMENTS

| | | |
|---|---|---|
| CH | 51805 A | 9/1911 |
| CH | 79206 A | 10/1918 |
| CH | 128905 A | 11/1928 |
| DE | 4223592 A1 | 1/1994 |
| EP | 0285745 B1 | 10/1988 |
| EP | 0658634 A1 | 6/1995 |
| EP | 0729173 A1 | 8/1996 |
| EP | 1081248 A2 | 3/2001 |
| WO | 2004057642 A2 | 7/2004 |

OTHER PUBLICATIONS

International Search Report for Application PCT/EP2007/057179 dated Nov. 15, 2007.
Gehan A. J. Amaratunga, Amorphous diamond-Si semiconductor heterojunctions, Applied Physics Letters, American Institute of Physics, Jul. 1, 1991, pp. 69-71, vol. 59-No. 1, Melville, NY.
Swiss Search Report, CH11662006, Nov. 3, 2006.

* cited by examiner

*Primary Examiner*—Rodney G McDonald
(74) *Attorney, Agent, or Firm*—Pearne & Gordon LLP

(57) ABSTRACT

Method for producing poorly conductive and in particular nonconductive layers on at least one work piece by means of a vacuum-coating process in which an electric arc discharge is activated between at least one anode and the cathode of an arc source in a reactive-gas atmosphere, whereby on the surface of a target that is electrically connected to the cathode either none or only a small outer magnetic field is generated that extends essentially perpendicular to the target surface for assisting the evaporation process, the degree of recoating of the target surface by other coating sources is less than 10%, and the magnetic field is generated with a magnet system that encompasses at least one axially polarized coil with a geometry similar to the circumference of the target.

46 Claims, 5 Drawing Sheets

METHOD FOR MANUFACTURING POORLY CONDUCTIVE LAYERS

THE TECHNOLOGY

Method for producing insulating layers by means of one or several arc sources, with only a minor magnetic field, or none, generated on the target surface for assisting in the evaporation process. More specifically, the method serves to produce oxides and to operate the said minimum of one arc source in an oxygenous atmosphere.

PRIOR ART

Employing prior-art arc techniques, it has been difficult at best, or altogether impossible, to operate arc sources in an oxygenous atmosphere, and especially in pure oxygen, in a manner suitable for industrial applications. For example, it has been found that using conventional arc sources whose magnetic fields are designed to guide the spark along an essentially circular path results in the deposition of thick oxide layers on the target surfaces, causing the coating process to become unstable. The target surface on which the spark travels becomes constricted, i.e. the spark travels on an ever diminishing surface of the target, whereby the passive target surface becomes heavily oxidized. This leads first to considerable spattering and ultimately to an unstable and eventually extinguished arc.

A process in which arc targets are flushed with an inert gas while the reactive gas is introduced near the substrate surface, cannot always be implemented in view of the substantial technical complexity of the system required, nor is it always successful, given the fact that too high an inert gas concentration results in the precipitation for instance of a mixture consisting of metal and the actually desired metal compound.

Another possible way to solve the problem is to use a pulsed arc current, either by simultaneously applying a DC and a pulse-modulated current as described in CH 00518/05 and CH 1289/2005, or by applying a single pulsed current. This allows several arc sources to be operated in continuous and stable fashion even in an oxygen atmosphere and in the process to coat their surfaces with an insulating layer. On the other hand, it is necessary to provide in addition to the DC power supply a pulsed-current source or a special, correspondingly expensive single generator capable of overlaying a suitable pulsed-current pattern on the basic operating current.

When depositing conductive layers such as TiN, AlTiN, AlCrN and others, it has been known for some time that, as the magnetic field extending parallel to the surface increases, the droplet density decreases, whereas, when the lines of flux are oriented perpendicular to the target surface, there is a tendency for larger macro-particles to be emitted. Examples of arc sources with lines of flux extending essentially parallel to the surface and with a smaller vertical magnetic field component have been described in CH 00792/06) and WO 2004/057642.

It is also known from DE 4223592 (Hovsepian) that for minimizing the number of droplets and optimizing the target yield it is possible to adjust an outer magnetic field to the respective value of the intrinsic magnetic field that is generated by the arc current in or on the target surface and does not exceed a value of 10 Gauss ($=10^{-3}$ Tesla). This can be achieved for instance by means of a coil interconnected between the target and the power source. In the process the performance of the evaporator is further stabilized through the inductivity of the field coil while at the same time plasma generation is augmented.

An altogether different approach is described in U.S. Pat. No. 6,334,405 which proposes orienting the lines of flux essentially perpendicular to the target surface. In that concept, the field-producing coil or the annular magnet is positioned at the same level as, or in front of, the target surface. At the same time, magnetic fields are employed that are significantly stronger than those used in the techniques referred to above.

There is no known prior-art method whereby magnetic fields are optimized in terms of arc evaporation for producing insulating or oxidic layers in the process of which nonconductive or at least poorly conductive layer sections are produced, at least temporarily, on the target surface as well. To date, because of the difficulties referred to above, no such arc methods have been employed in industrial applications for depositing this type of layers, nor have they been mentioned in prior art on more than a few isolated occasions.

There is one exception, patent EP0285745B1, which describes droplet reduction in arc evaporation on the basis of a mutual coating for instance of two opposing arc targets. The underlying observation indicates that, after the vacuum coating system has been pumped down and immediately after the arc has been ignited, the arc will initially be split more strongly, generating fewer droplets. The document describes a method for coating work pieces with different metallic compounds such as TiN, ZrN and $ZrO_2$, where the arc target is exposed to recoating by a suitably positioned second evaporation source at a ratio of 12 to 25% of its own evaporation rate. The coils serving to generate the magnetic fields above the arc targets are Helmholtz coils that are positioned outside the vacuum and permit an augmentation of the mutual coating rate even at magnetic field intensities as low as about 10 Gauss. That method, however, presents a problem for several reasons. For one, it is necessary to maintain a particular target arrangement and to ensure uniformity of the coating. For another, the mutual coating will always be at the expense of the deposition rate on the work pieces and, consequently, of the economic effectiveness of the method.

DESCRIPTION OF THE INVENTION

It is the objective of this invention to introduce a method for depositing marginally conductive and, in particular, nonconductive layers through arc evaporation, avoiding the drawbacks of prior art techniques and making it possible to implement a corresponding arc evaporation process at a high productivity level. Another objective is to provide a method whereby it is possible for the first time, even without using pulsed arc sources and/or simultaneous flushing of the arc sources with an inert gas and the concurrent recoating of the evaporated target surface, to operate over an extended length of time a stable arc evaporation process in a reactive-gas atmosphere, precipitating marginally conductive or nonconductive layers.

Surprisingly, it has been found that, with a relatively simple step such as the application of a small outer magnetic field essentially next and perpendicular to the target surface, employing at least one axially polarized coil having a geometry similar to the circumference of the target and with a vertical component $B_z$ as well as an essentially smaller component $B_r$ extending radially above or parallel to the larger part of the target surface, it is possible to implement a coating process with long-time stability for producing poorly conductive and, specifically, nonconductive layers. In this case, the vertical component $B_z$ on the target surface is preferably held within a range between 3 and 50 Gauss but more particularly within a range between 5 and 25 Gauss.

This method also obviates the need, described in prior art, for reciprocal coating, so that the degree of a recoating of the target surface by other coating sources can be held at less than 10%, preferably less than 5% and most desirably less than 1% or 0% than [sic] the amount of metal delivered by the cathode.

Alternatively, the method according to the invention can be implemented even entirely without a magnetic field, although in that case one could not take advantage of the benefit of increased ionization, which occurs even when only small magnetic fields are applied above the target surface.

It follows that the arc source(s) can in essence be positioned in any desired way, for instance in a parallel, mutually angled or opposite arrangement while the work pieces to be coated may be placed or moved between several arc sources at will, the result being better utilization of the target material and an increased coating rate. It also allows for dispensing with other traditional activities such as the flushing of the targets with an inert gas or the admixture of larger inert-gas components to the reactive gas. Specifically, the process can be implemented with an inert-gas component of less than 30%, preferably less than 10%, or without the addition of any inert gas. Nor is it necessary in this case to combine this present invention with the process enhancement described in CH 00518/05 (reactive pulsed arc) and CH 1289/2005 (dual pulsed arc) by applying a pulsed signal to the arc cathode(s), although for certain purposes such combination can be beneficial, for instance when increased ionization, better target utilization, a higher coating rate or a faster movement of the spark on the target surface is desired.

The magnetic field above or on the target surface must be so adjusted that it is not strong enough to restrict the spark to geometrically defined paths. To that effect, the vertical component $B_z$ of the magnetic field is set at a value of less than 50 Gauss but preferably less than 25 Gauss. The component $B_r$ will have to be set at a correspondingly lower value.

Employing processes of this type for depositing marginally conductive or nonconductive layers makes it possible to avoid the problems encountered in DC processes with a magnetic field-supported arc source, such as broad contamination of the target surface with a consequently declining coating rate, a constriction of the active target surface and a deterioration of the process stability potentially all the way to the failure of the arc source. At the same time, this method permits the attainment of a better surface quality of the coated work pieces, since even at comparably small arc currents the spark splits up into several small foci that travel rapidly across the target surface, thus permitting uniform target ablation with low droplet emission. It thus appears that, compared to conductive surfaces, the contamination of the target surface additionally contributes to a better spark distribution pattern.

This effect is particularly conspicuous in the case of nonconductive layers that increase the electron emission of the metallic target surface. Examples include aluminum oxide layers or aluminum metal oxide layers which can be produced in an oxygenous atmosphere by evaporating the aluminum alloyed for instance with one or several of the subgroup IV to VI transition metals as well as Fe, Si, B and C, or preferably from an AlTi, AlTa, AlV, AlCr or an AlZr alloy. This preferably involves the use of no inert gas at all, or of only a relatively small component of an inert gas or nitrogen, preferably less than 20% by volume and especially less than 10% by volume for ensuring complete oxidation of the metal particles evaporated from the targets. A similarly good spark distribution on the target surface can be observed in the generation of boridic insulating layers, such as $TiB_2$. In this case as well, the process can be implemented in a borane-containing atmosphere, for instance with diborane, without or with only a small admixture of an inert gas or of nitrogen.

A possible explanation for this phenomenon, without asserting completeness or scientific proof, may be the difference in the electron emission or electron affinity of the metal surfaces to be insulated and of the oxidic surfaces. For example, aluminum oxide exhibits a substantially higher electron emission rate than does aluminum metal. Presumably, then, the method according to the invention generates a spark pattern that is controlled by the electron emission of the contaminated surface. Since the spark is no longer forced into a particular path by the transverse acceleration of a radial magnetic field, it prefers to jump to the target areas with the highest electron emission. In the case of an aluminum target that is arc-evaporated in an oxygen atmosphere, it will move to the point where the aluminum oxide layer grows fastest. Here, a weak vertical magnetic field can further promote emission, whereas too strong a vertical magnetic field would have a negative effect. The latter may be due to the fact that magnetic fields cannot be generated, with technically and financially justifiable means, in a way as to be totally homogeneous across a target surface. Moreover, in the case of stronger vertical magnetic fields there will always be an incremental parallel component that will ultimately restrict the free movement of the spark on the surface. The spark can be held on the target front face by conventional means such as confinement rings of an insulating material (e.g. boron nitride), or highly conductive confinement rings that repel the spark via an eddy-current field generated in the ring by the moving spark itself.

For producing technical layer systems with special functional features it will be desirable, depending on the intended use, to apply jointly with the above-mentioned insulating layers additional layers on the work piece, i.e. for instance metallic, nitridic, carbidic or carbonitridic bonding and/or hard layers, with the final coating step preferably consisting of the application of an oxygenous or oxide layer. The latter could serve for instance as a lead-in or oxidation-protection layer for the hard layers underneath. Other layer systems can be deposited by essentially conventional methods but preferably by PVD processes such as sputtering, low-voltage arc coating, and especially again by spark evaporation. Equally possible with the method according to the invention is the creation of multilayer systems in which conductive and nonconductive layers alternate, or whereby different nonconductive layers can be deposited. This can be accomplished for instance by the alternating operation of an arc source in a nitrogen and, respectively, oxygen atmosphere, or by employing several arc sources with different target materials, whereupon one material is deposited as a nitride, carbonitride or some other compound and the other material as a nonconductive oxide. It is further possible, in contrast to other PVD and CVD methods, to easily produce between the layers, i.e. between nonconductive and conductive layers, transition layers for instance with an increasing or decreasing oxygen content, which constitutes a significant advantage of the method according to the invention. By comparison, sputtering leaves unstable parameter segments due to target surface contamination (hysteresis curve), causing abrupt changes in the precipitation conditions. Equally obviated is the need for the cumbersome adjustment of different temperature levels for the deposition of different hard materials and for inert-gas flushing between individual process steps as is the case in CVD processing. In general, this method can be applied at temperatures well below those used in CVD applications, thus making it suitable for instance for the coating of steel as well.

When depositing multilayers, a problem encountered may be the need to evaporate different target materials, some of which can be evaporated with acceptable target utilization only by the application of a magnetic field. In these cases it may prove useful to superimpose on the DC source current an additional pulse signal. More specific information on this procedural technique is contained in the aforementioned patent applications CH 00518/05 and CH 1289/2005, which address two possibilities for this type of pulsed operation in detail. In addition, as will be evident from what has been explained further above, the magnet system used in the arc evaporation of a straight metal target material can be subjected to requirements different from those for a magnet system used to evaporate the same material with an oxide coat. For example, it will be advantageous in the arc evaporation of TiAl for the precipitation of TiAlN to operate the source with a magnet system. Depending on the Ti/Al ratio, different magnet systems will produce optimal results, employing magnetic fields of an order of magnitude that is within the magnetic field intensity range specified above or may even be higher. If in any such cases, for instance when permanent magnets are used, it is not possible to adapt the magnetic field intensity to the various evaporation conditions (such as a metallic, nitridic or oxidic target surface), it will be desirable or indeed necessary in the case of an oxidic target surface and correspondingly large magnetic fields to provide an additional pulse signal.

Similar conditions apply to the implementation of graduated layers and mixed layers composed of oxides and for instance nitrides and/or carbides. In these cases the atmosphere used is not only pure oxygen but, instead, gas mixtures with a varying and often small oxygen component. Under these conditions the electron emission on the target surface is not controlled entirely by the oxygen alone since only a partly oxide-coated target surface is available. Here as well it may be advantageous to additionally pulse the target current.

Although in general it is possible with the method according to the invention to deposit nonconductive layers without the need for additional measures, it may nevertheless be advantageous, as mentioned above, to simultaneously drive the arc source with both a direct current and a pulsed or alternating current. In that case the DC component of the current flow is preferably selected in the range between 100 and 300% and ideally between 100 and 200% of the holding current. The term holding current refers to the lowest current level at which a stable operation of an electrically conductive arc source is still possible with a simple DC power supply. The value of the holding current, i.e. holding capacity, is determined by the target material, the architecture of the arc source and the discharge mode, for instance whether the discharge takes place in a vacuum with or without the addition of an inert or a reactive gas. For common target materials used in conjunction with arc sources as described in more detail below, this translates into a DC current flow in the range between 30 and 90 A, preferably between 30 and 60 A.

In one particular embodiment the pulsed-current supply can be operated between a cathode and, positioned separately from the arc source, a second electrode, in particular the cathode of another arc source. Alternatively, the pulsed current supply may be interconnected between the arc source and some other type of source such as the sputter cathode of a sputter source, especially of a magnetron.

A magnetic field can be generated for instance by feeding an excitation current to an essentially conventional axially polarized magnet system consisting of at least one coil with a geometry similar to the circumference of the target. The magnet system is positioned essentially on the same level as the target surface or, preferably, behind the target surface so as to permit a relatively simple placement of the coil in the atmosphere. In the interest of space economy the geometric configuration of the magnet system may be kept somewhat smaller than the target circumference. However, if a particularly even vertical distribution is desired, a matching or even slightly larger geometry, permitting for instance the encompassing of the target and positioned parallel and as close as possible to the geometric plane of the target surface, will be beneficial. Using Helmholtz coils far from the source, generating a magnetic field over a large area of the system, is neither necessary nor is it desirable for flexibility considerations.

This type of magnetic field can be generated in particularly simple fashion in that the direct current and/or pulsed or alternating current of the power source is/are fed to the cathode via a coil, for instance a coil designed as mentioned above. In that case no generator is needed for the field coil. Using this type of series connection of the coil and cathode is particularly useful in pulsed operation where it leads to additional ionization which in turn supports pulsed operation and enhances electron emission. For the above-mentioned source currents the number of coil windings is desirably selected between 1 and 20, preferably between 1 and 10 and ideally between 1 and 5 turns. This also makes it possible to essentially adjust the magnetic field to the respective magnitude of the intrinsic magnetic field of the arc current which in most cases remains at a level below or equal to 10 Gauss. A briefly higher outer magnetic field generated for instance when a pulse peak or a steep pulse side passes through the coil will not normally cause any disturbance.

Of course, as an alternative it is possible to feed the magnetic field separately from a DC or a pulsed arc source with its own power supply and drive unit. If the arc source is pulsed as well, synchronization can be provided.

In this fashion, with an appropriate configuration of the coils and, if necessary, the addition of an annular magnet, larger magnetic fields can be generated whenever a greater plasma density is needed. In that case, however, it will be advantageous in the deposition of insulating layers to add to the DC signal applied to the arc sources a pulsed signal as referred to above.

It will also be advantageous to implement the method using an arc source where a confinement ring is positioned between, and electrically insulated from, the cathode and the anode, which ring consist either of a nonconductive material such as BN or a highly conductive metal such as Al, Cu or Ag. Especially when combined with a small magnetic field, this will ensure that the spark is prevented from falling off the target surface.

BRIEF DESCRIPTION OF THE DRAWINGS

The following describes this invention in more detail with the aid of drawings which merely illustrate various implementation examples and in which:

FIG. 1 reveals the surface condition of different spark targets employed in a pure oxygen atmosphere. For this test, targets having a diameter of 160 mm and a thickness of 6 mm were mounted on a Balzers standard arc source in an RCS coating system and run for 50 minutes using different magnet systems with a source current of 180 A in a pure oxygen atmosphere. The operating parameters were as follows:

| | |
|---|---|
| Source current$_{arc}$: | 180 A |
| O$_2$ flow: | Incrementally increased from 400 sccm to 1600 sccm, working in a pure oxygen atmosphere. |
| Increment size/span: | 300 sccm/10 min. |
| Process pressure: | 0.44 to 4.9 Pa |
| Substrate voltage: | Bipolar asymmetric pulse: −100 V/36 μs, +100 V/4 μs |
| T$_{substrate}$: | 550° C. |

Figure 1:
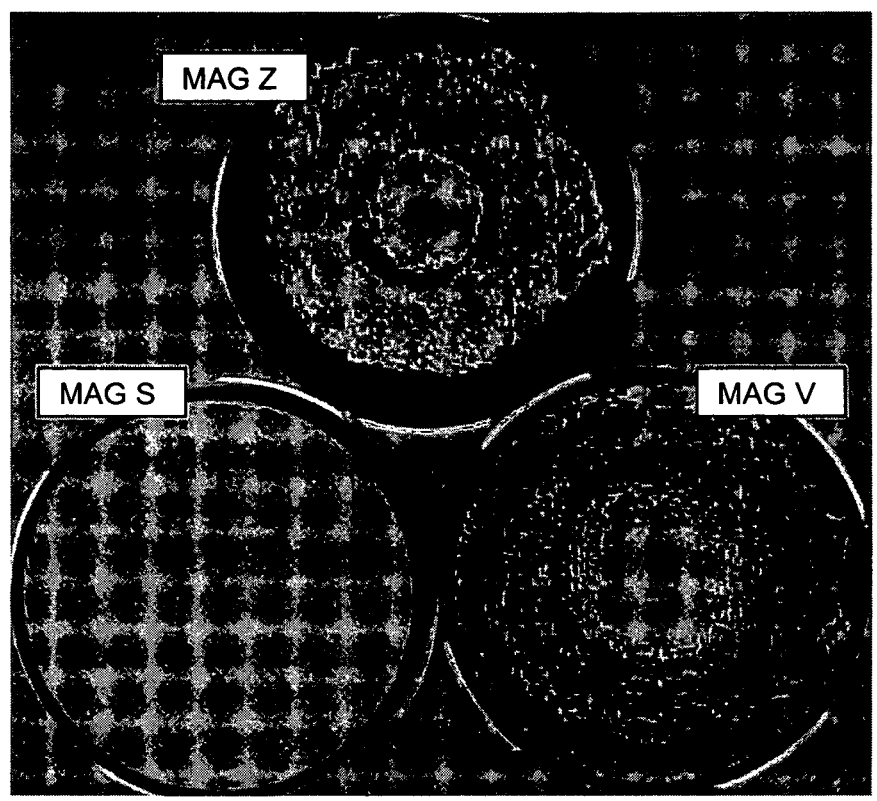
FIG. 1 shows surfaces of reactively arced targets.

In FIG. 1, "MAG Z" and "MAG V" designate two targets that were operated with a relatively strong magnetic field having a well-defined radial component B$_r$. In both cases the surface reveals a very irregular erosion pattern as well as distinct, essentially circular spark tracks. The spark has left relatively deep grooves and, already visually recognizable, maximal erosion in the center of the target. In both cases, the surface is so rough and damaged that without resurfacing both targets are no longer reusable. The spark path itself grows progressively narrower during the operation, the result being an unstable process. Until now, a pattern such as this could be largely avoided only by means of a pulsed target current as described in CH 00518/05 and CH 1289/2005. That, however, requires an additional investment and special power supplies.

The surface of "MAG S" in FIG. 1, on the other hand, exhibits an altogether different picture. Except for the magnetic field, it was operated under application of the same parameters as for the surfaces of targets MAG Z and MAG V in FIG. 1. The surface appears to have been ablated evenly across the entire region, which was then verified by profilometric measurements. This result requires a small magnetic field with at least one small radial component. The vertical component can be selected somewhat more freely. The following will briefly discuss the major differences between the magnet systems employed.

Figure 2:
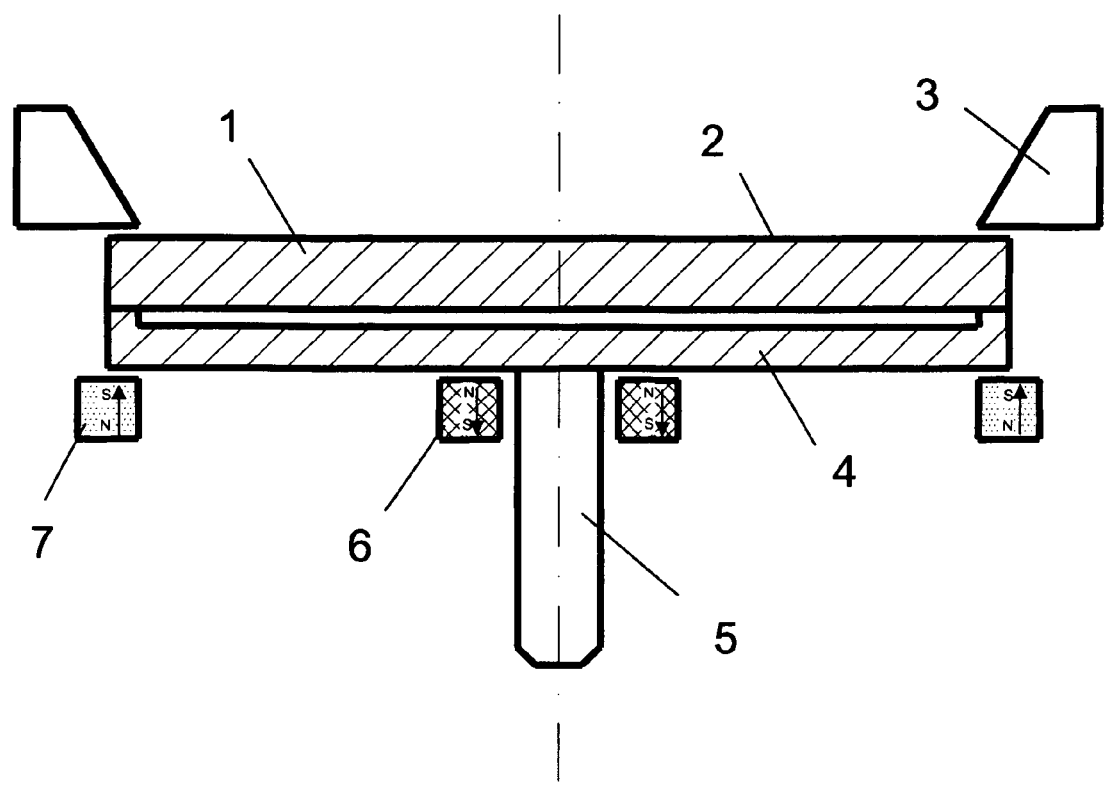
FIG. 2 depicts an arc source with magnet system.

FIG. 2 is a schematic cross-sectional view of an arc source with a magnet system of the type used for the targets MAG Z and MAG V in FIG. 1. Surrounding the surface 2 of a target 1 mounted on a cooling plate 4 is a continuous confinement ring 3 serving to confine the spark to the target surface. The usual counter-electrode, typically a cathode that is itself annular, is not shown here. Positioned in the central rear section of the target is the power input 5 which may include cooling-water infeed and outlet tubing, again not illustrated. Also located in the central rear section is an annular inner permanent magnet 6 while an annular outer magnet 7 is positioned near the perimeter of the target. The two annular magnets are axially magnetized with mutually opposite polarity, whereby part of the lines of flux exiting from the upper side of the outer annular magnet 7 reenter in the upper side of the inner annular magnet 6, while the electric flux pattern on the back side in relation to the circular plane is essentially mirror-inverted. The field intensity can be modified for instance by means of magnets of different magnetic strength and, additionally, a coil such as the one in FIG. 5, or by other means.

Figure 3:
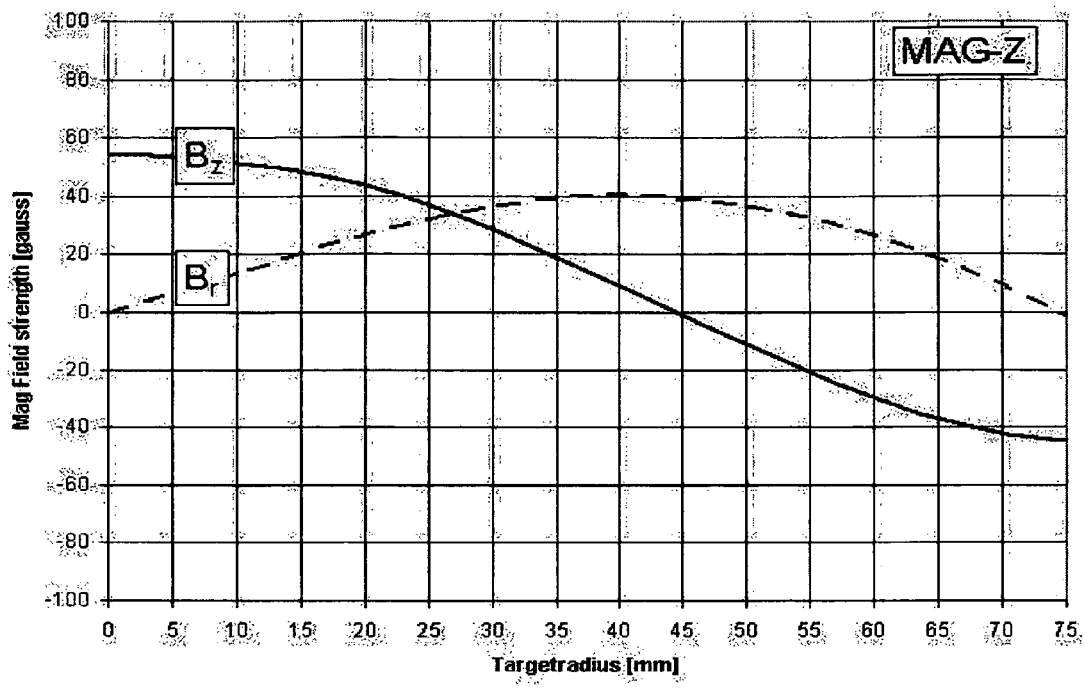
FIG. 3 shows field intensity Z by a conventional method.

FIG. 3 shows the local field intensity of a magnet system on the surface of an arc target in a corresponding configuration employing a Balzers production-type "MAG Z" magnet system. The diagram shows the field-intensity curve of the vertical component B$_z$ and of the radial component B$_r$ on one half of the target. B$_z$ reaches a maximum in the center (0-coordinate) and again at the edge (75 mm) while traversing the zero line at about 45 mm. The 45° point defined by the intersection of the absolute components, meaning the point or section where the lines of flux impinge on the target surface at an angle of 45°, is located near 27 and, respectively, 59 mm. In the intermediate region the radial component B$_r$ is greater than B$_z$ and passes through a maximum. Unlike B$_z$, B$_r$ does not change direction in the target half concerned but intersects the zero line at the zero point and at the edge of the target. As was to be expected, the intermediate region in which the spark(s) traveling across the target is/are subjected to relatively high radial acceleration forces, is a preferred destination, which is clearly visible in the corresponding "MAG Z" erosion pattern shown in FIG. 1. On the other hand, as a result of the very small radial component in the central region of the target and the correspondingly slow movement of individual sparks that are leaving the preferred destination, overheating and associated explosive evaporation cause increased erosion, surface damage and an increase in droplet formation. This effect is of less significance at the target perimeter because, compared to the central region, fewer sparks per area unit cross over from the preferred destination while at the same time an eddy-current field self-induced in the confinement ring, consisting of a metal such as copper, pushes the spark back.

Figure 4:
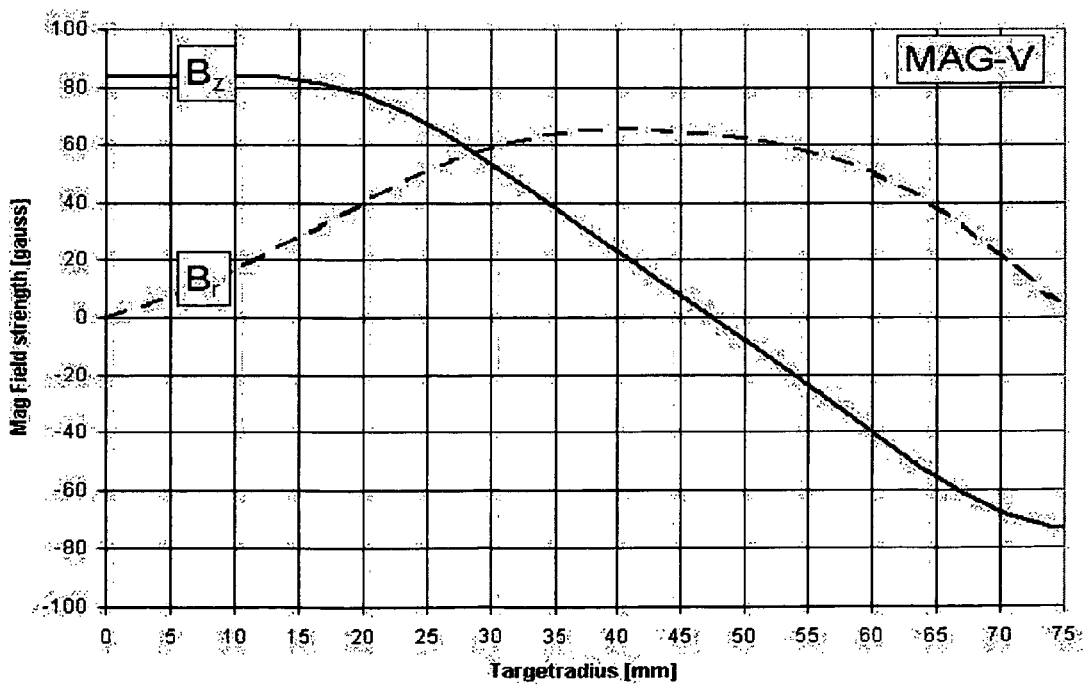
FIG. 4 shows field intensity V by a conventional method.

FIG. 4 shows the corresponding characteristic field-intensity curve for the evaporation of the target illustrated in FIG. 1, using the "MAG V" magnet system. With a basically similar characteristic curve, the magnetic field differs from that in FIG. 3 by a field intensity which on average is about 50% higher for both components. Accordingly, the "MAG V" target surface in FIG. 1 exhibits stronger erosion even in the outer region. In this case as well, the surface is seriously damaged.

Figure 5:
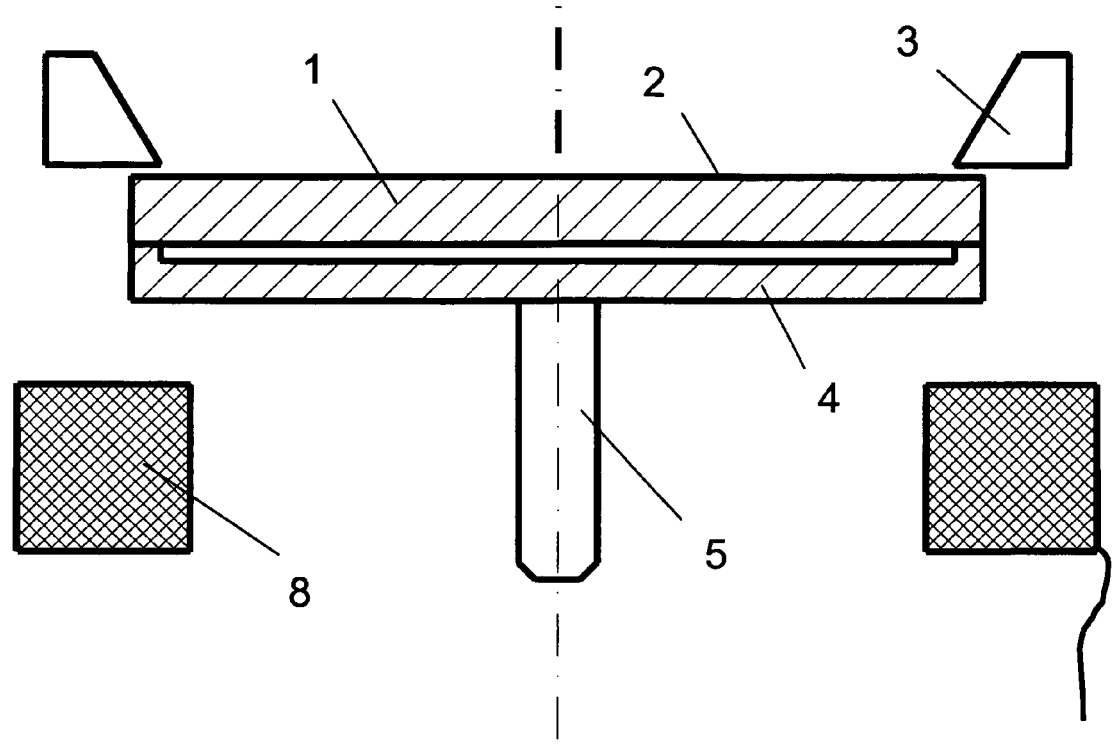
FIG. 5 depicts an arc source with coil.

Finally, FIG. 5 is a schematic cross-sectional illustration of an arc source employing a "MAG S" magnet system 8, used for evaporating the surface of the "MAG S" target in FIG. 1 through application of the method according to the invention. In lieu of the annular permanent magnets 6 and 7 in FIG. 2, the configuration in this case employs an electromagnetic coil 8 mounted behind the target 1 within the projection area of the target circumference.

Along this concept, advantageous magnet system designs are composed of one or several electromagnetic coils without, or with only minor, support provided by strong permanent magnets. These systems permit coil-current changes to match changes in the condition of the target surface. For example, in the creation of a continuous transition from a conductive nitridic hard layer to a nonconductive oxidic layer, the magnetic field can be downward-adjusted parallel to the nitrogen ramp while the oxygen flow is continuously increased. It is thus possible even without a pulsed arc-source operation to produce any desired continuous transitions with materials that require magnetic-field support for evaporating the conductive surface.

Figure 6:
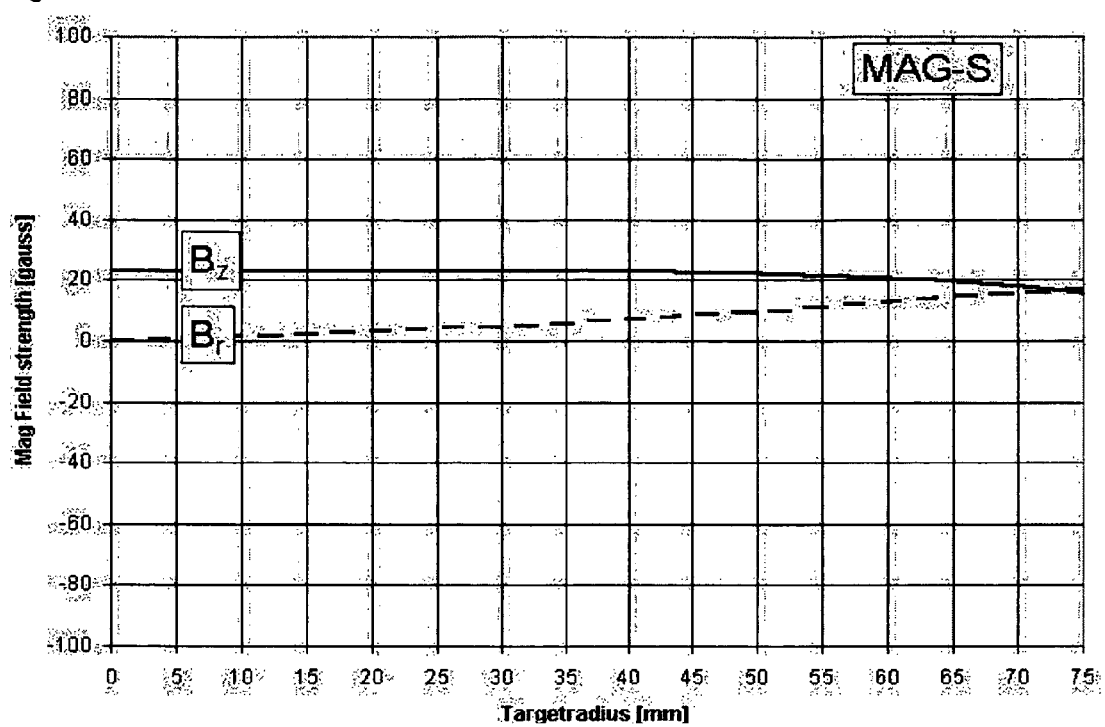
FIG. 6 shows the field intensity by the method according to the invention.

FIG. 6 illustrates the field intensity obtained when operating this type of magnet system at low currents. In this particular case, a Balzers production "MAG S" magnet system (432 coil turns) was operated with a 1 A current. It is thus possible, as illustrated, to obtain magnetic fields with a highly uniform progression of the $B_z$ component as well as a $B_r$ component with a very low average value. It will be advantageous to select a $B_z$ component of less than 50 Gauss, in particular less than or equal to 30 Gauss. While, surprisingly, the arc sources can be operated in an oxygen atmosphere basically without magnetic-field support, at an acceptable rate and with an erosion pattern similar to that of "MAG S" in FIG. 1, the use of a magnet system as just described will nevertheless result in a somewhat better distribution pattern. Such an effect has been noticed even in the case of fields with a $B_z$ of less than 10 Gauss, for instance 3 and 5 Gauss. A concomitant benefit is a highly uniform $B_z$ curve which over much of the target surface does not fluctuate by more than 10 to a maximum of 20%. A slightly larger deviation is acceptable only in the peripheral region of the target, about 10 to 20 mm from the target rim. Moreover, a magnet system of that type facilitates coating processes in which the target is sequentially used for generating conductive and marginally conductive or nonconductive layers, since it allows an adjustment of the fields to the respective processing step. Of course, to optimize these processes, other magnet systems known to those skilled in the art may be employed as well. For example, in some processes the use of an additional system that is vertically adjustable relative to the target plane would prove beneficial in obtaining, with larger magnetic fields on the target surface, a favorable magnetic-field distribution perhaps comparable to FIGS. 3 and 4, for instance in the production of certain metal nitrides.

The following example describes the complete progression of a coating process according to the invention, using a weak, essentially vertical magnetic field in the area of the target surface.

After the work pieces were mounted on appropriate bi- or triaxially rotatable holders and the holders were moved into the vacuum processing system, the processing chamber was pumped down to a pressure of about $10^{-4}$ mbar.

For setting the process temperature, a low voltage arc (LVA) plasma, assisted by radiant heater elements, was ignited in an argon-hydrogen atmosphere between a baffle-separated cathode chamber with a hot cathode and the anodic work pieces.

The parameters for the heating process were selected as follows:

| | |
|---|---|
| Discharge current LVA | 250 A |
| Argon flow | 50 sccm |
| Hydrogen flow | 300 sccm |
| Process pressure | $1.4 \times 10^{-2}$ mbar |
| Substrate temperature | approx. 550° C. |
| Process duration | 45 min. |

Those skilled in the art are aware of possible alternatives. As a matter of preference, the substrates were connected to function as anodes for the low voltage arc and were additionally pulsed in unipolar or bipolar fashion.

The next procedural step was the initiation of the etching process by activating the low voltage arc between the filament and the auxiliary anode. Here as well, a DC, pulsed DC or alternating-current MF or RF supply may be interpolated between the work pieces and frame ground. Preferably, however, the work pieces are fed a negative bias voltage.

The etching parameters were selected as follows:

| | |
|---|---|
| Argon flow | 60 sccm |
| Process pressure | $2.4 \times 10^{-3}$ mbar |
| Discharge current, LVA | 150 A |
| Substrate temperature | approx. 500° C. |
| Process duration | 45 min. |
| Bias | 200–250 V |

To ensure a stable low voltage arc (LVA) discharge during the generation of nonconductive layers, all LVA-assisted process steps included either the use of a hot, conductive auxiliary anode or the interconnection of a pulsed high-current power supply between the auxiliary anode and frame ground.

The next procedural step was the coating of the substrate with an AlCrO layer and a TiAlN intermediate layer. If a higher ionization level is needed, all coating processes can be further assisted by the plasma of the low voltage arc.

The parameters for depositing the intermediate TiAlN layer were selected as follows:

| | |
|---|---|
| Argon flow | 0 sccm (no argon added) |
| Nitrogen flow | Pressure-controlled at 3 Pa |
| Process pressure | $3 \times 10^{-2}$ |
| DC source current, TiAl | 200 A |
| Source magnetic field current (MAG S) | 1 A |
| DC substrate bias | U = −40 V |
| Substrate temperature | approx. 550° C. |
| Process duration | 25 min. |

For the transition of about 15 minutes to the actual functional layer the AlCr arc sources were powered with a DC source current of 200 A, with the positive pole of the DC source connected to the annular anode of the source and to frame ground. During that phase the substrate was fed a DC substrate bias of −40 V. 5 minutes after activation of the AlCr target the oxygen infeed was started and then adjusted within 10 minutes from 50 to 1000 sccm. At the same time, the $N_2$ flow was reduced to about 100 sccm. Just prior to the oxygen intake the substrate bias was switched from DC to bipolar pulsed operation and increased to U=−60 V. At the end of the oxygen ramp the two TiAl targets were turned off. The intermediate layer and the graduated transition to the functional layer were now complete.

Coating the substrate with the actual functional layer is performed in pure oxygen. Since aluminum oxide is an insulating layer, either a pulsed or an AC bias supply must be used.

The main parameters for the functional layer were selected as follows:

| | |
|---|---|
| Oxygen flow | 1000 sccm |
| Process pressure | $2 \times 10^{-2}$ mbar |
| DC source current, Al | 200 A |
| Source magnetic field current (MAG S) | 0.5 A |
| Substrate bias | U = 60 V (bipolar, 36 µs negative, 4 µs positive) |
| Substrate temperature | approx. 550° C. |
| Process duration | 60 to 120 min. |

The process described above yielded well-bonding, hard layers. Comparison tests performed on drilling and milling tools revealed a product life distinctly longer than that obtainable with conventional TiAlN layers, although surface roughness significantly exceeded the roughness level of optimized, pure TiAlN layers.

What is claimed is:

1. Method for producing layers on at least one work piece by means of a vacuum-coating process in which an electric arc discharge is activated between at least one anode and a cathode of an arc source in a reactive-gas atmosphere, characterized in that on the surface of a target that is electrically connected to the cathode an outer magnetic field is generated, extending essentially perpendicular to the target surface and encompassing a vertical component $B_z$ as well as a smaller magnitude radial or surface-parallel component $B_r$, for assisting the evaporation process, in that a magnet system consisting of at least one axially polarized coil with a geometry similar to the target circumference is fed an excitation current, said outer magnetic field being small enough as not to force said electric arc discharge into a particular path over said target surface, wherein the magnitude of $B_r$ is smaller than the magnitude of $B_z$ across a major proportion of the target surface.

2. Method as in claim 1, characterized in that the vertical component $B_z$ on the target surface is selected within a range of between 3 and 50 Gauss.

3. Method as in claim 1, characterized in that the magnet system is positioned essentially on one level with the target surface.

4. Method as in claim 1, characterized in that the arc discharge or at least the minimum of one arc source is simultaneously fed a direct current as well as a pulsed or alternating current.

5. Method as in claim 4, characterized in that by means of an insulating layer on the target surface an increase of the DC component of the source voltage by at least 10% compared to the operation with a surface without an insulating layer is achieved.

6. Method as in claim 4, characterized in that a pulsed current supply is interpolated between the cathode of an arc source as the first electrode and a second electrode that is positionally separated from the arc source.

7. Method as in claim 6, characterized in that the said second electrode functions as the cathode of another arc source which on its part is connected to a DC power supply.

8. Method as in claim 6, characterized in that the said second interconnected electrode is a sputter cathode.

9. Method as in claim 1, characterized in that at least two targets are functionally arranged in a mutually angled or opposite position and that at least one work piece is placed between the targets.

10. Method as in claim 1, characterized in that the excitation current is a direct current and/or the pulsed or alternating current fed from a power source to the cathode via the said coil.

11. Method as in claim 10, characterized in that the coil is so configured that, when the excitation current is flowing, the outer magnetic field essentially adjusts itself to the value of the intrinsic magnetic field of the arc current.

12. Method as in claim 11, characterized in that a coil with between 1 and 20 turns is employed.

13. Method as in claim 1, characterized in that a target of an aluminiferous alloy is used and that an aluminiferous alloy or an aluminous-alloy compound is evaporated off the target surface.

14. Method as in claim 13, characterized in that said alloy contains pure aluminum or an alloy of the aluminum with one or several of the subgroup IV to VI transition metals as well as Fe, Si, B and C.

15. Method as in claim 1, characterized in that the reactive-gas atmosphere contains oxygen or consists of oxygen and that an oxidic layer is deposited.

16. Method as in claim 15, characterized in that in addition to a minimum of one oxidic layer at least one other bonding and/or hard layer is deposited on the work piece, with the final coating step.

17. Method as in claim 16, characterized in that at least once between two directly successive bonding, hard and/or oxide layers a transition layer, containing elements of the two directly successive layers, is deposited.

18. Method as in claim 1, the reactive-gas atmosphere contains a boronic compound or consists of a boronic compound and that a boronic layer is deposited.

19. Method for producing on at least one work piece by means of a vacuum-coating process in which an electric arc discharge is activated between at least one anode and the cathode of an arc source in a reactive-gas atmosphere, characterized in that on the surface of a target that is electrically connected to the cathode either none or only an outer magnetic field is generated, extending essentially perpendicular to the target surface and encompassing a vertical component $B_z$ as well as a smaller magnitude radial or surface-parallel component $B_r$, for assisting the evaporation process, said outer magnetic field being small enough as not to force said electric arc discharge into a particular path over said target surface, said arc source being operated in a vacuum coating system either by itself or other coating sources are functionally integrated into the system in a manner whereby the degree of recoating of the target surface is less than 10% of the amount of metal evaporated by the cathode, wherein the magnitude of $B_r$ is smaller than the magnitude of $B_z$ across a major proportion of the target surface.

20. Method as in claim 19, characterized in that the vertical component $B_z$ on the target surface is set at less than 50 Gauss.

21. Method for producing layers on at least one work piece by means of a vacuum-coating process in which an electric arc discharge is activated between a cathode and an anode of an arc source in a reactive-gas atmosphere, characterized in that the arc discharge is operated with a direct-current and/or a pulsed or alternating-current generator, that on the surface of a target that is electrically connected to the cathode an outer magnetic field is generated, extending essentially perpendicular to the target surface for assisting the evaporation process, said outer magnetic field being small enough as not to force said electric arc discharge into a particular path over said target surface, and that between the cathode and the anode, electrically insulated from both, a confinement ring is positioned which consists either of an electrically insulating material or of a conductive metal such as wherein the magnitude of a radial or surface-parallel component of said outer magnetic field is smaller than the magnitude of a vertical component of said outer magnetic field across a major proportion of the target surface.

22. Method as in claim 2, said vertical component $B_z$ on the target surface being selected within a range of between 5 and 25 Gauss.

23. Method as in claim 3, characterized in that the magnet system is positioned behind the target surface.

24. Method as in claim 4, characterized in that by means of an insulating layer on the target surface an increase of the DC component of the source voltage by at least 20% compared to the operation with a surface without an insulating layer is achieved.

25. Method as in claim 11, characterized in that a coil with between 1 and 10 turns is employed.

26. Method as in claim 11, characterized in that a coil with between 1 and 5 turns is employed.

27. Method as in claim 14, said alloy containing an AlTi, AlTa, AlV, AlCr or AlZr alloy.

28. Method as in claim 15, said oxidic layer being an oxide.

29. Method as in claim 16, said at least one other bonding and/or hard layer being an oxidic layer.

30. Method as in claim 29, said oxidic layer being an oxide layer.

31. Method as in claim 18, said boronic layer being a boride layer.

32. Method as in claim 31, said boronic layer being TiB2.

33. Method as in claim 19, whereby the degree of recoating of the target surface is less than 5% of the amount of metal evaporated by the cathode.

34. Method as in claim 19, whereby the degree of recoating of the target surface is less than 1% of the amount of metal evaporated by the cathode.

35. Method as in claim 20, said vertical component $B_z$ on the target surface being set at less than 25 Gauss.

36. Method for producing layers on at least one work piece by means of a vacuum-coating process in which an electric arc discharge is activated between at least one anode and a cathode of an arc source in a reactive-gas atmosphere, characterized in that on the surface of a target that is electrically connected to the cathode an outer magnetic field is generated, extending essentially perpendicular to the target surface and encompassing a vertical component $B_z$ as well as a radial or surface-parallel component $B_r$, for assisting the evaporation process, the magnitude of said radial component $B_r$ of the magnetic field being smaller than the magnitude of said vertical component $B_z$ at every location over the target, said outer magnetic field being small enough as not to force said electric arc discharge into a particular path over said target surface.

37. Method as in claim 36, said vertical component $B_z$ being less than 50 Gauss.

38. Method as in claim 36, said reactive-gas atmosphere consisting of oxygen.

39. Method as in claim 1, wherein the magnitude of $B_r$ is smaller than the magnitude of $B_z$ from the center of the target surface to a radius of at least about 75 mm.

40. Method as in claim 19, wherein the magnitude of $B_r$ is smaller than the magnitude of $B_z$ from the center of the target surface to a radius of at least about 75 mm.

41. Method as in claim 21, wherein the magnitude of said radial or surface-parallel component is smaller than the magnitude of said vertical component from the center of the target surface to a radius of at least about 75 mm.

42. Method as in claim 1, said layers comprising non-conductive layers.

43. Method as in claim 19, said layers comprising non-conductive layers.

44. Method as in claim 21, said layers comprising non-conductive layers.

45. Method as in claim 36, said layers comprising non-conductive layers.

46. Method as in claim 21, said electrically insulating material comprising BN, said conductive material comprising Al, Cu or Ag.

* * * * *

UNITED STATES PATENT AND TRADEMARK OFFICE
CERTIFICATE OF CORRECTION

| | | |
|---|---|---|
| PATENT NO. | : 7,857,948 B2 | Page 1 of 1 |
| APPLICATION NO. | : 11/458444 | |
| DATED | : December 28, 2010 | |
| INVENTOR(S) | : Ramm et al. | |

It is certified that error appears in the above-identified patent and that said Letters Patent is hereby corrected as shown below:

Column 12, line 55, remove the words "such as"

Signed and Sealed this
Twenty-sixth Day of April, 2011

David J. Kappos
*Director of the United States Patent and Trademark Office*